US009613773B2

(12) United States Patent
Ottlinger et al.

(10) Patent No.: US 9,613,773 B2
(45) Date of Patent: Apr. 4, 2017

(54) ELECTRICAL COMPONENT AND METHOD FOR ESTABLISHING CONTACT WITH AN ELECTRICAL COMPONENT

(71) Applicant: EPCOS AG, Munich (DE)

(72) Inventors: Marion Ottlinger, Deutschlandsberg (AT); Robert Krumphals, Deutschlandsberg (AT); Andreas Stani, Leibnitz (AT)

(73) Assignee: EPCOS AG, Munich (DE)

( * ) Notice: Subject to any disclaimer, the term of this patent is extended or adjusted under 35 U.S.C. 154(b) by 127 days.

(21) Appl. No.: 14/431,726

(22) PCT Filed: Sep. 9, 2013

(86) PCT No.: PCT/EP2013/068633
§ 371 (c)(1),
(2) Date: Mar. 26, 2015

(87) PCT Pub. No.: WO2014/048713
PCT Pub. Date: Apr. 3, 2014

(65) Prior Publication Data
US 2015/0255237 A1    Sep. 10, 2015

(30) Foreign Application Priority Data

Sep. 28, 2012 (DE) .................. 10 2012 109 250

(51) Int. Cl.
| | | |
|---|---|---|
| *H01L 41/083* | (2006.01) | |
| *H01H 57/00* | (2006.01) | |
| *H01L 41/047* | (2006.01) | |
| *H01L 41/293* | (2013.01) | |
| *H01H 45/14* | (2006.01) | |
| *H01H 49/00* | (2006.01) | |

(52) U.S. Cl.
CPC ............ *H01H 57/00* (2013.01); *H01H 45/14* (2013.01); *H01H 49/00* (2013.01); *H01L 41/0472* (2013.01); *H01L 41/293* (2013.01)

(58) Field of Classification Search
CPC  H01L 41/083; H01L 41/0472; H01L 41/0838
USPC ................................. 310/328, 365
See application file for complete search history.

(56) References Cited

U.S. PATENT DOCUMENTS

| | | | |
|---|---|---|---|
| 6,208,026 B1 | 3/2001 | Bindig et al. | |
| 6,522,052 B2 * | 2/2003 | Kihara | ............... H01L 41/0472 310/363 |
| 6,794,800 B1 * | 9/2004 | Heinz | ................ H01L 41/0472 310/366 |

(Continued)

FOREIGN PATENT DOCUMENTS

| | | |
|---|---|---|
| CN | 101405882 A | 4/2009 |
| CN | 101978518 A | 2/2011 |

(Continued)

*Primary Examiner* — J. San Martin
(74) *Attorney, Agent, or Firm* — Slater Matsil, LLP (57) ABSTRACT

An electrical component includes at least one external contact having a first metallization and a second metallization. The metallizations are fired and the second metallization only partly covers the first metallization. Furthermore, an electrical component includes at least one frame-shaped metallization. Furthermore, an electrical component includes a first and second metallization that have a different wettability with solder material.

16 Claims, 4 Drawing Sheets

(56) References Cited

U.S. PATENT DOCUMENTS

| | | | |
|---|---|---|---|
| 7,205,706 B2 * | 4/2007 | Kadotani | H01L 41/0472 310/328 |
| 7,339,310 B2 * | 3/2008 | Kobane | F02M 47/027 310/366 |
| 7,385,337 B2 * | 6/2008 | Mochizuki | H01L 41/0472 310/363 |
| 7,969,066 B2 | 6/2011 | Kasai et al. | |
| 8,638,025 B2 | 1/2014 | Gabl et al. | |
| 2001/0026114 A1 * | 10/2001 | Takao | H01L 41/0472 310/364 |
| 2001/0033125 A1 * | 10/2001 | Takao | H01L 41/04 310/366 |
| 2006/0022558 A1 | 2/2006 | Bindig et al. | |
| 2008/0007144 A1 | 1/2008 | Takei et al. | |
| 2008/0136293 A1 * | 6/2008 | Mochizuki | H01L 41/0471 310/358 |
| 2010/0327703 A1 | 12/2010 | Uetani et al. | |
| 2011/0168806 A1 | 7/2011 | Nakamura | |
| 2012/0132729 A1 | 5/2012 | Nakamura | |
| 2012/0187211 A1 * | 7/2012 | Nakamura | F02M 51/0603 239/102.2 |
| 2013/0233278 A1 * | 9/2013 | Sato | H01L 41/0472 123/456 |
| 2015/0171306 A1 * | 6/2015 | Kato | F02M 51/0603 123/456 |

FOREIGN PATENT DOCUMENTS

| | | | | |
|---|---|---|---|---|
| CN | 102132432 A | 7/2011 | | |
| CN | 102449792 A | 5/2012 | | |
| DE | 10356961 A1 | 6/2005 | | |
| EP | 0844678 B1 | 8/2002 | | |
| EP | 2267808 A1 | 12/2010 | | |
| EP | 2337103 A1 | 6/2011 | | |
| EP | 2437322 A1 | 4/2012 | | |
| JP | 2005533386 A | 11/2005 | | |
| JP | 2008243924 A | 10/2008 | | |
| JP | DE 102008043651 A1 * | 6/2009 | | H01L 41/0472 |
| JP | WO 2015114866 A1 * | 8/2015 | | H01L 41/0472 |
| WO | 2007114002 A1 | 10/2007 | | |
| WO | 2009116548 A1 | 9/2009 | | |
| WO | 2010020643 A1 | 2/2010 | | |
| WO | 2010024199 A1 | 3/2010 | | |
| WO | 2010137618 A1 | 12/2010 | | |

* cited by examiner

ELECTRICAL COMPONENT AND METHOD FOR ESTABLISHING CONTACT WITH AN ELECTRICAL COMPONENT

This patent application is a national phase filing under section 371 of PCT/EP2013/068633, filed Sep. 9, 2013, which claims the priority of German patent application 10 2012 109 250.8, filed Sep. 28, 2012, each of which is incorporated herein by reference in its entirety.

TECHNICAL FIELD

An electrical component having at least one metallization is specified. In particular, the metallization is provided for establishing contact with internal electrodes of the component. The electrical component is embodied as a piezoactuator, for example. Furthermore, a method for establishing contact with an electrical component is specified.

BACKGROUND

The document WO 2010/020643 A1 describes a piezoactuator having an external contact-connection, wherein a wire fabric is fixed to a base metallization. The document EP 0844678 B1 specifies a piezoactuator having a three-dimensionally structured, electrically conductive electrode connected to a base metallization via partial contact locations.

SUMMARY

Embodiments specify an improved electrical component. Further embodiments specify a method for producing an electrical component.

An electrical component is specified. By way of example, the component is embodied as a piezoactuator, in particular as a piezoactuator for actuating an injection valve in a motor vehicle. The component preferably has a main body. The main body preferably has internal electrodes. The internal electrodes are embodied as electrode layers, for example.

The component is preferably embodied as a multilayer component. By way of example, functional layers and electrode layers are stacked alternately one above another in the main body. The functional layers are, for example, piezoelectric layers, in particular piezoceramic layers. The internal electrodes preferably extend alternately in the stacking direction as far as one outer side of the main body and are spaced apart from the opposite outer side. The stack of electrode layers and functional layers is preferably embodied as a monolithic sintering body.

The electrical component has at least one external contact having at least one metallization. The external contact is preferably embodied for establishing contact with internal electrodes of the main body. The metallization is preferably arranged on an outer side of the main body. The metallization is preferably embodied in a layer-shaped fashion. The metallization preferably establishes contact with every second internal electrode. A further metallization can be provided for establishing contact with the further internal electrodes, said further metallization being arranged, for example, on an opposite outer side of the main body.

In accordance with a first aspect of the invention, the electrical component has an external contact comprising a first metallization and a second metallization, wherein the second metallization is arranged on the first metallization. The first metallization is preferably arranged directly on an outer side of the main body and preferably in direct electrical contact with internal electrodes of the main body. The metallizations preferably serve for establishing electrical contact with the internal electrodes. Both metallizations are embodied as fired metallizations. The first metallization only partly covers the second metallization.

In order to produce a fired metallization, by way of example, a metallic paste is applied to an outer side of the main body. Afterward, the metallic paste is fired, for example, at a temperature in the range of 500° C. to 900° C.

Preferably, in order to produce the first metallization, a first metallic paste is applied to an outer side of the main body and fired. Afterward, in order to produce the second metallization, a second metallic paste is applied to the first metallization and fired. In the case of such a two-stage firing process of the metallizations, mixing of the materials of the metallizations can be prevented particularly well. In particular, diffusion of material constituents from one of the metallizations into the other metallization can be prevented.

In accordance with one embodiment, the first and second metallizations have a different wettability with solder material. By way of example, the solder material is a tin-silver solder.

What can be achieved by means of the different wettability is that a contact element which is intended to be fixed to at least one of the metallizations is fixed to one of the two metallizations sufficiently strongly and is fixed less well or is not fixed to the other metallization. Consequently, a fixing region of the contact element can be determined by the form of the metallization having the higher wettability.

Preferably, the first metallization has a lower wettability with solder material than the second metallization. By way of example, for fixing the contact element to the first metallization, the contact element can be provided with solder material over a large area and can be placed onto the metallizations. Alternatively, solder material can be applied to the exposed areas of the metallizations over a large area. A soldering process is subsequently carried out. On account of the different wettability of the metallizations with solder material, the contact element adheres well to the second metallization and adheres less well or does not adhere to the first metallization.

In accordance with one embodiment, the first metallization has a glass portion and the second metallization has no glass portion or a smaller glass portion than the first metallization.

On account of the glass portion in the first metallization, it is possible to obtain a particularly secure connection of the first metallization to the main body, in particular to ceramic layers of the main body. As a result of the absent or smaller glass portion in the second metallization, the wettability of the second metallization with solder material is preferably increased in comparison with the first metallization.

Preferably, the second metallization has a smaller area than the first metallization.

In this case, the area of the respective metallization preferably denotes the main area of a layer-shaped metallization. The main area preferably runs parallel to the outer side of the main body on which the metallizations are arranged.

On account of the large area of the first metallization, good linking to the main body can be achieved. On account of the smaller area of the second metallization, a contact element can be fixed in a desired, smaller region, such that, for example, the flexibility of the contact element is impaired only to a small extent by the fixing region. As a result, cracks in the main body, in particular, can be bridged by the contact element.

The first metallization is embodied over the whole area, for example. This means that the first metallization is embodied as a continuous area and has no cutouts. By way of example, the second metallization has at least one cutout.

In one embodiment, the second metallization is embodied in a frame-shaped fashion. In particular, the second metallization can be embodied as a closed frame enclosing a cutout. Alternatively, the frame shape can also have openings. By way of example, the frame shape has one or more perforations. Preferably, no region of the second metallization is situated within the frame shape. In particular, the first metallization can be covered by the second metallization at no point whatsoever within the frame shape.

In one embodiment, the second metallization has at least two partial regions. A gap is preferably formed between the partial regions. By way of example, the partial regions are embodied in a strip-shaped fashion. The partial regions preferably run parallel to the stacking direction of electrode layers and functional layers stacked one above another. The second metallization can have only two parallel, strip-shaped partial regions, for example. The second metallization can alternatively also be embodied in a U-shaped fashion, for example. In this case, two partial regions arranged parallel are connected to one another at one end of the partial regions by a third partial region. The U-shape can also be regarded as a frame shape, here an opening being formed in the frame shape.

In one embodiment, a contact element is fixed to at least one of the metallizations. Preferably, the contact element is fixed to the second metallization.

Preferably, the contact element is embodied in a flexible fashion. In this way, under mechanical loading, the contact element can yield without cracking. In particular, the contact element can bridge cracks that occur in the main body, and can thus ensure a reliable electrical connection of the component. Preferably, the contact element has at least one cutout.

The contact element can have a net or fabric structure. The contact element has a multiplicity of wires, for example. In particular, the contact element can be embodied as a wire fabric or wire mesh. Alternatively, the contact element can also be embodied as a metallic plate. One or a plurality of cutouts, for example, circular cutouts, can be provided in the metallic plate.

The contact element is preferably soldered on at least one of the metallizations. Preferably, the contact element is soldered on the second metallization. The contact element can additionally also be soldered on the first metallization. In the case where the first metallization has a low wettability with solder material, the contact element, for example, is not soldered with the first metallization or is soldered with the first metallization only with low adhesive strength.

Preferably, at least one lateral edge region of the contact element is directly fixed to the second metallization. In particular, no part of the edge region projects beyond the second metallization. This makes it possible to prevent an unfixed part of the edge region from leading to damage to the component. By way of example, in the case of a frame-shaped second metallization, the contact element is fixed to the frame and does not project laterally beyond the frame. In particular, in the case of a U-shaped second metallization, the contact element can be fixed to the second metallization at three lateral edge regions. Preferably, the contact element does not project laterally beyond the first metallization.

In one embodiment, a further contact-connection is fixed to the contact element. The further contact-connection preferably serves for electrically connecting the component to a voltage source. By way of example, the further contact-connection has a wire or a multiplicity of wires. Preferably, the further contact-connection is embodied as a contact pin.

The further contact-connection is preferably not arranged above the second metallization. In this case, the term "above" denotes the direction of the surface normal from the outer side of the main body provided with the second metallization. In particular, the further contact-connection is not arranged above a fixing region of the contact element on one of the metallizations. In this way, the further contact-connection can be fixed to the contact element particularly well, without damage to the component occurring.

By way of example, the further contact-connection is welded on the contact element. The further contact-connection can be pressed onto the contact element during the fixing step. If the contact element is not directly fixed to a metallization in this region, the contact element can yield, for example, as a result of which a good contact between the contact element and the further contact-connection can be obtained. Furthermore, in this case, the base metallization is not damaged during the fixing step, in particular a welding or soldering process.

The further contact-connection is preferably arranged at least partially above the first metallization. By way of example, in the case of a U-shaped configuration of the second metallization, the further contact-connection extends through the opening of the U-shaped region into the interior of the U-shaped region.

In accordance with a further aspect of the invention, an electrical component comprising at least one external contact having at least one metallization is specified, wherein the metallization is embodied in a frame-shaped fashion. The component can have all the functional and structural properties of the component described above. In particular, the component can have a first and second metallization as described above. In this case, at least one of the metallizations is embodied in a frame-shaped fashion. Alternatively, the component can also have only one metallization.

The metallization has, in particular, a cutout delimited by the frame. The frame shape of the metallization can have openings. By way of example, the frame shape can be embodied in a U-shaped fashion. The frame shape can also be embodied as a closed frame. The metallization is preferably embodied as a fired metallization.

In one embodiment, a contact element as described above is fixed to the frame-shaped metallization. Preferably, at least one lateral edge region of the contact element is directly fixed to the frame. In addition, a further contact-connection, in particular in the form of a contact pin, can be fixed to the contact element.

In accordance with a further aspect of the invention, an electrical component comprising at least one external contact having a first metallization and a second metallization is specified, wherein the second metallization is arranged on the first metallization. The first and second metallizations are fired. The first and second metallizations have a different wettability with solder material. The component can have all the functional and structural properties of the component described above. In particular, the different wettability can be produced by means of a different glass portion. The second metallization can only partly cover the first metallization. Alternatively, the second metallization can also completely cover the first metallization.

In accordance with a further aspect of the invention, a method for establishing electrical contact with an electrical component is specified. A main body of an electrical component is provided and a first metallic paste is applied on an outer side of the main body. Afterward, the first metallic paste is fired to form a first metallization. Subsequently, a second metallic paste is applied to the first metallization and, afterward, the second metallic paste is fired. The components described above can be produced by the method. In particular, the constituent parts used in the method can have all the functional and structural properties of the constituent parts of the components described above.

A contact element can be fixed, in particular soldered, on at least one of the metallizations. For this purpose, the contact element is coated, for example, generously with solder material. The first and second metallizations can have a different wettability with solder material. What can be achieved in this way is that the contact element is fixed only to one of the metallizations and is not fixed or is fixed less well to the other metallization. Furthermore, a further contact-connection as described above can be fixed, for example, welded, on the contact element.

BRIEF DESCRIPTION OF THE DRAWINGS

The subjects described here are explained in greater detail below on the basis of schematic exemplary embodiments, which are not true to scale. In the figures.

Preferably, in the following figures, identical reference signs refer to functionally or structurally corresponding parts of the different embodiments.

DETAILED DESCRIPTION OF ILLUSTRATIVE EMBODIMENTS

Figure 1:
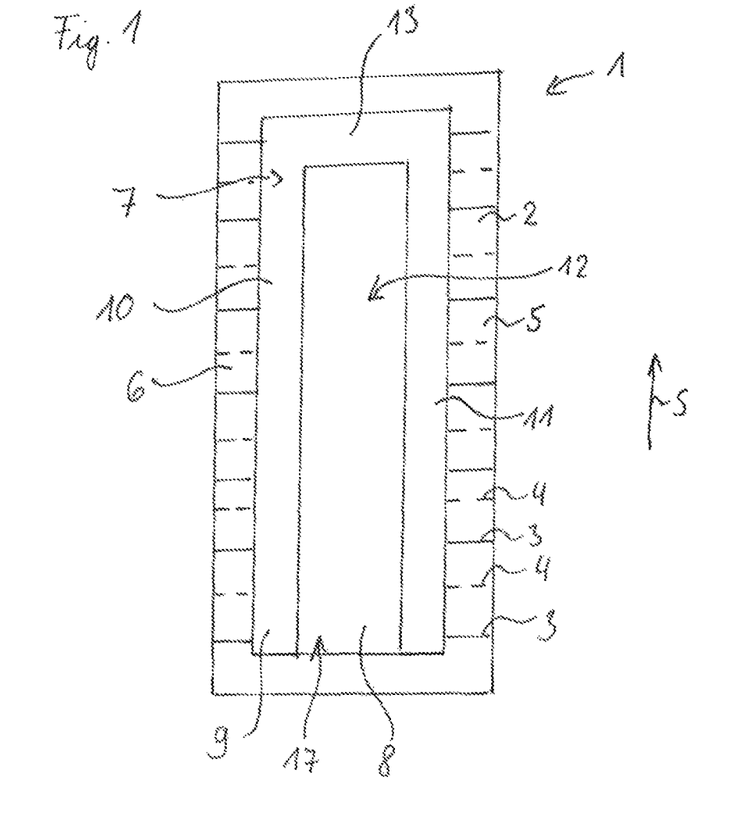
FIG. 1 shows a plan view of an electrical component.
Figure 2:
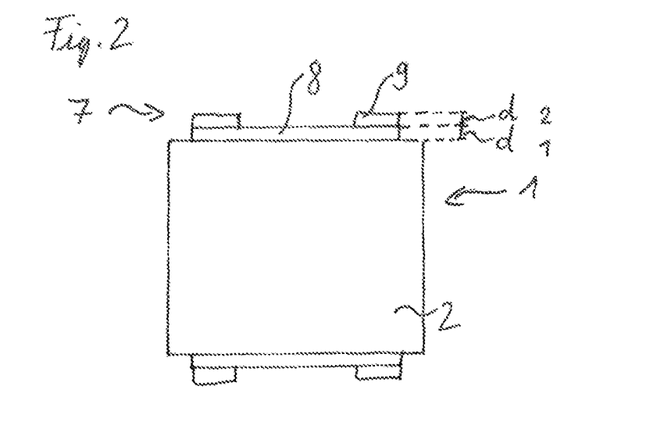
FIG. 2 shows a cross section of the component from FIG. 1.

FIG. 1 shows a plan view of an electrical component 1. FIG. 2 shows a cross section of the component from FIG. 1.

The electrical component 1 is preferably a piezoelectric component, in particular a piezoactuator. The component 1 is embodied as a multilayer component. The component 1 has a main body 2, in which first and second internal electrodes 3, 4 and functional layers 5 are stacked alternately one above another along a stacking direction S.

The internal electrodes 3, 4 extend alternately as far as one outer side 6 of the main body 2 and are spaced apart from an opposite outer side (not depicted). By way of example, the internal electrodes 3, 4 contain copper, silver, or silver-palladium.

The functional layers 5 are embodied, for example, as dielectric layers, in particular as piezoelectric layers. The functional layers 5 can be formed from a ceramic material, in particular can be embodied as piezoceramic layers. Preferably, the component 1 expands when a voltage is applied between the internal electrodes 3, 4. The expansion takes place, for example, in the stacking direction S.

For establishing contact with the first internal electrodes 3, an external contact 7 is arranged on an outer side 6 of the main body 2. The external contact 7 has a first metallization 8 and a second metallization 9. The first metallization 8 is in direct contact with the functional layers 5 and the first internal electrodes 3. The second metallization 9 is arranged on the first metallization 8 and is in direct contact with the first metallization 8. The metallizations 8, 9 are embodied in a layer-shaped fashion. The second metallization 9 only partly covers the outer side of the first metallization 8 on which it is arranged, i.e., the outer side of the first metallization 8 facing away from the main body 2, and leaves partial regions of the outer side of the first metallization 8 uncovered.

Both metallizations 8, 9 are embodied as fired metallizations. In particular, the metallizations 8, 9 are produced by a metallic paste being applied and fired. Preferably, firstly the first metallization 8 is applied, for example, by screen printing, and fired. Afterward, the second metallization 9 is applied, for example, by screen printing, and fired.

Both metallizations 8, 9 contain a metal. Preferably, at least one of the metallizations 8, 9 contains copper. Alternatively or additionally, the metallizations 8, 9 can contain silver or silver-palladium. The metallizations 8, 9 can also contain different metals; by way of example, one of the metallizations can contain copper and the other metallization can contain silver.

The first metallization 8 contains a glass portion, in particular a glass frit. The glass portion preferably ensures the adhesive strength of the metallization 8 on the outer side 6 of the main body 2, for example, on a ceramic material of the main body 2. Preferably, the glass portion in the first metallization 8 is between 3 and 10 percent by weight (% by weight). By way of example, the glass portion is 6% by weight. The glass portion in the first metallization 8 has the consequence that the wettability of the first metallization 8 with a solder material is low.

The second metallization 9 has no glass portion or has a smaller glass portion than the first metallization 8. During the firing of the second metallization 9, however, a small glass portion from the first metallization 8 can diffuse into the second metallization 9, with the result that, even if a paste without a glass portion is used for producing the second metallization 9, a small glass portion can be present after firing in the second metallization 9. Such diffusion can be completely or largely prevented by means of two-stage firing of the metallizations 8, 9. The first metallization 8 can have a higher porosity than the second metallization 9.

By way of example, the second metallization 9 consists of a metal. The second metallization 9 has a good wettability with a solder material on account of the absent or small glass portion.

The first metallization 8 is embodied in the form of a rectangular area. In particular, the first metallization 8 has no cutouts, that is to say is embodied over the whole area.

The second metallization 9 has two strip-shaped partial regions 10, 11 running parallel to one another. The partial regions 10, 11 run in the stacking direction S. Between the partial regions 10, 11 the second metallization 9 has a cutout 12, through which the first metallization 8 can be seen. The two partial regions 10, 11 are connected to one another by a third partial region 12. The third partial region 12 runs perpendicularly to the stacking direction S. The second metallization 9 is embodied overall in a U-shaped fashion. In particular, the second metallization 9 is embodied in a frame-shaped fashion, wherein an opening 17 is provided in the frame shape.

In one alternative embodiment, the second metallization 9 has only the two partial regions 10, 11 arranged parallel to one another, and does not have the third partial region 12. In a further alternative embodiment, the second metallization 9 has a fourth partial region, which connects the two partial regions 10, 11 arranged parallel at an opposite end relative to the third partial region 13. In this case, the second metallization 9 would be embodied in the form of a rectangular frame. The invention is not restricted to the exact form of the second metallization. By way of example, circular cutouts can also be arranged in the second metallization 9.

In the fired state, the first metallization 8 preferably has a thickness $d_1$ (see FIG. 2) in the range of 5 µm to 30 µm. By way of example, the thickness $d_1$ is 20 µm. The second metallization 9 has, for example, a thickness $d_2$ (see FIG. 2) in the range of 10 µm to 60 µm. By way of example, the thickness $d_2$ is 40 µm. The thicknesses $d_1$ and $d_2$ can also be identical. By way of example, both thicknesses $d_1$, $d_2$ can be 20 µm.

The area of the first metallization 8 is larger than the area of the second metallization 9. The large area of the first metallization 8 makes it possible to ensure a good adhesive strength of the external contact 7 on the outer side 6. The smaller area of the second metallization 9 makes it possible to fix a contact element to the second metallization 9 in a smaller fixing region. The different degree of wettability of the first and second metallizations 8, 9 makes it possible, in a simple manner, for a contact element to be fixed only to the second metallization 8 and not, or only to a small degree, to the first metallization 9. This allows, for example, fixing of the contact element only in fixing regions defined by the second metallization 9.

Figure 3:
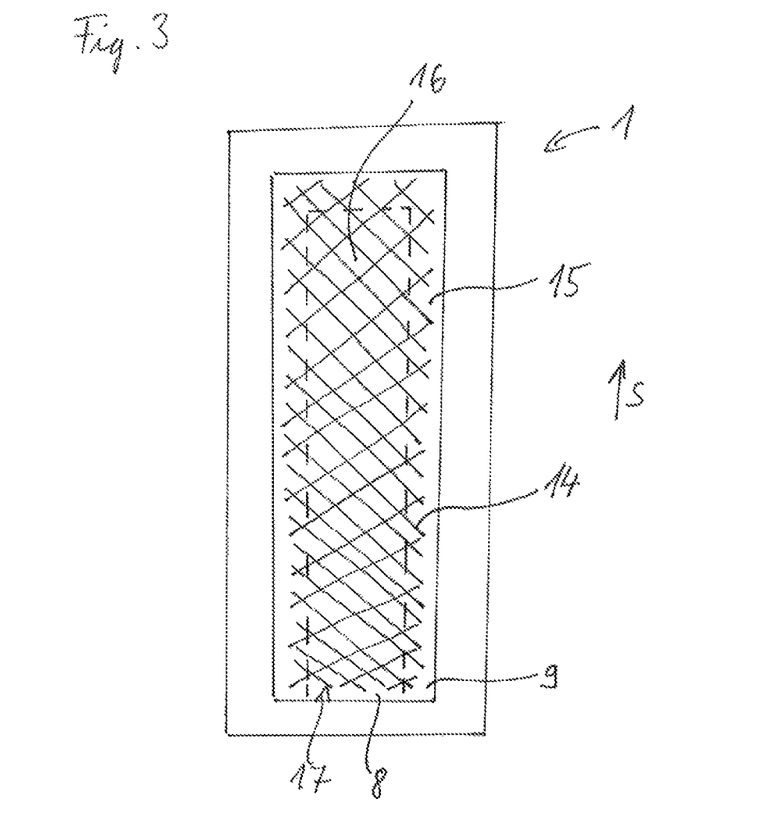
FIG. 3 shows a plan view of an electrical component having a contact element.

FIG. 3 shows a plan view of an electrical component 1 comprising a contact element 14.

The electrical component 1 is embodied like the component described in FIGS. 1 and 2, wherein the external contact 7 here additionally has a contact element 14 arranged on the second metallization 9. The internal electrodes are not depicted here, for reasons of clarity. The contact element 14 has a net-like structure, in particular a fabric structure. In particular, the contact element 14 has a multiplicity of metallic wires interwoven with one another.

The contact element 14 is soldered on the second metallization 9. By virtue of the different wettability of the first and second metallizations 8, 9 with a solder material, the solder material adheres well to the second metallization 9, but adheres only poorly or does not adhere at all to the first metallization 8. Consequently, a fixing region 15, in which the contact element 14 is soldered with the underlying metallization 8, 9, is determined by the geometry of the second metallization 9. Consequently, for soldering the contact element 14 in the fixing region 15, a solder material can be applied over a large area on the contact element 14 or the metallizations 8, 9. On account of the good wettability of the second metallization 9, the contact element 14 is fixedly connected to the second metallization 9 by the solder material. On account of the poor wettability of the first metallization 8, the contact element 14 is not connected to the first metallization 8, or is connected thereto only with low adhesive strength. Consequently, the contact element 14 can be fixed only in a desired fixing region 15 in a simple manner. In particular, the contact element 14 can be fixed only partially, i.e., only in parts of its outer area, while—in a region of low adhesive strength 16—the contact element 14 is not connected to the main body 2 or is connected thereto only with low adhesive strength 16. This makes it possible, for example, to electrically bridge cracks in the main body 2 which can occur during a polarization of the component 1 or during operation. Preferably, the contact element 14 is embodied in a flexible fashion, such that upon the occurrence of mechanical stresses produced, e.g., by a crack in the main body 2, said contact element is expanded without cracking.

Figure 4A:
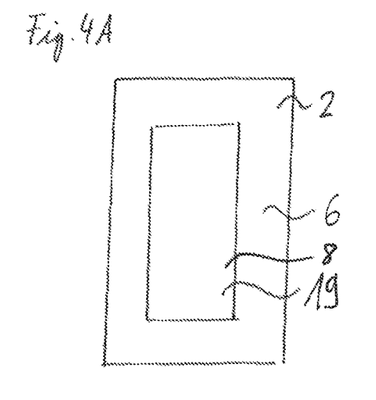
FIGS. 4A, 4B, 4C, 4D show method steps when establishing contact with an electrical component.
Figure 4B:
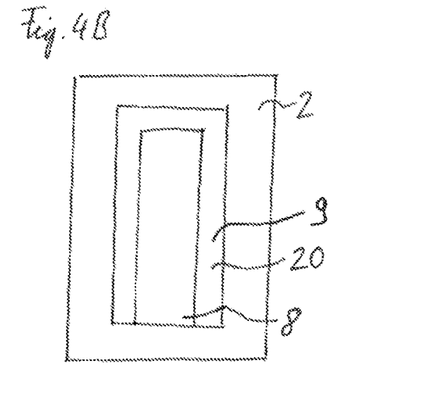
Figure 4C:
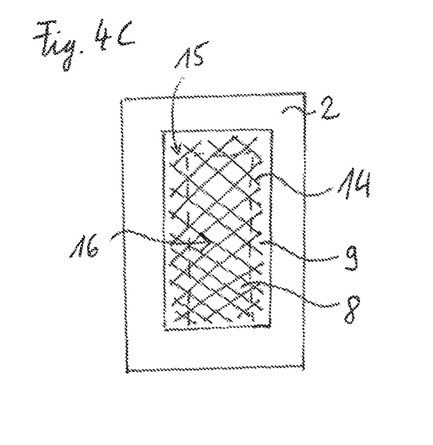
Figure 4D:
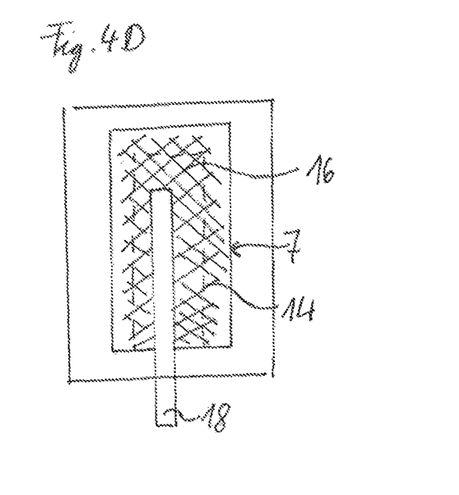

For the electrical connection of the external contact 7, a further contact-connection 18, for example, a contact pin, can be fixed to the external contact 7 (see FIG. 4D). Preferably, the further contact-connection 18 extends above the opening 17 into the frame shape of the second metallization 9. Preferably, the further contact-connection 18 is not arranged into a region above the second metallization 9.

FIGS. 4A, 4B, 4C and 4D show method steps when establishing contact with an electrical component, for example, a component 1 shown in FIGS. 1 to 3.

In accordance with FIG. 4A, a main body 2 of a component 1 is provided. For the purpose of forming a first metallization, a first metallic paste 19 is applied to an outer side 6 of the main body 2, for example, in a screen printing method. The first metallic paste 19 is applied in the form of a rectangle filled over the whole area. The first metallic paste 19 contains a metal, for example, copper, and a glass portion. Afterward, the first metallic paste 19 is fired. By way of example, the firing step takes place at a temperature of 760° C. in an $N_2$ atmosphere.

In accordance with FIG. 4B, for the purpose of forming the second metallization 9, a second metallic paste 20 is applied to the first metallization 8 thus obtained, for example, in a screen printing method. The second metallic paste 8 is embodied in a U-shaped fashion. The second metallic paste 8 contains a metal, for example, copper, but no glass portion. Afterward, the second metallic paste 20 is fired. By way of example, the firing step likewise takes place at 760° C.

One or a plurality of further, thin metallic layers are optionally applied to the second metallization 9 obtained. Said layers can be embodied for the protection of the second metallization 9, in particular in the case of a second metallization 9 comprising copper. By way of example, the layers are applied by sputtering. By way of example, a copper layer and thereabove a silver layer can be applied to the second metallization 9. By way of example, the copper layer is 0.3 µm thick and the silver layer is 0.4 µm thick. The silver layer preferably dissolves in a solder material. By applying the further layers, it is possible to improve the solderability of the second metallization 9.

In accordance with FIG. 4C, a contact element 14 is subsequently arranged above the first and second metallizations 8, 9. The contact element 14 is embodied, for example, as a wire fabric. The contact element 14 can already be provided with a solder material before being arranged on the main body 2. By way of example, the contact element 14 is electroplated with the solder material. In particular, the contact element 14 can be provided with solder material on its entire surface facing the main body 2. A connection of the contact element 14 to the second metallization 9 is then produced by means of the solder material being heated. On account of the good wettability of the second metallization 9, the contact element 14 is fixedly connected to the second metallization 9. Consequently, a fixing region 15 of the contact element 14 9 arises at the location of the second metallization. On account of the poor wettability of the first metallization 9 with the solder material, the contact element 14 is not connected to the first metallization 8 or is connected thereto only with low adhesive strength. Consequently, a region of low adhesive strength 16 arises in a region above the first metallization 8 which is not covered by the second metallization 9.

During the soldering of the contact element 14, the contact element 14 is preferably pressed onto the main body 2. By virtue of the fact that the second metallization 9 is arranged on the first metallization 8 and a step is thus formed between the first and second metallizations 8, 9, the press-on pressure on the second metallization 9 is higher than on the first metallization 8. The different press-on pressure additionally supports the different adhesive strength of the contact element on the second metallization 9.

The outer geometrical dimensioning of the contact element 14 is preferably somewhat smaller than the outer dimensioning of the second metallization 9. Consequently, the contact element 14 does not project laterally beyond the second metallization 9. In particular, lateral edge regions of the contact element 14 are soldered with the second metallization 9. The reliability of the component 1 can be increased in this way. In particular, it is possible to prevent projecting regions of the contact element 14 from being damaged, leading to the detachment of the contact element 14 or leading to a short circuit.

In accordance with FIG. 4D, a further contact-connection 18 can optionally be fixed to the external contact 7. The further contact-connection 18 can be embodied as a contact pin. The further contact-connection 18 is placed onto the contact element 14 and welded with the contact element 14, for example.

The further contact-connection 18 extends via the opening 17 of the second metallization 9 into a central region above the U-shaped second metallization 9. In the case of such an arrangement of the further contact connection 18, the further contact connection 18 can be fixed to the contact element 14 particularly reliably. During the welding process, the further contact-connection 18 can be pressed onto the contact element 14, wherein a good contact between the further contact-connection 18 and the contact element 14 can be established as a result of the compliance of the contact element 14 in the region of low adhesive strength 16. Furthermore, in the case of an arrangement of the further contact-connection 18 in such a way that the contact pin is not arranged above the second metallization 9, the risk of damage to the external contact 7 during the welding process is reduced. Furthermore, a further contact-connection 18 arranged in this way does not impair or only slightly impairs an expansion of the component 1.

Figure 5:
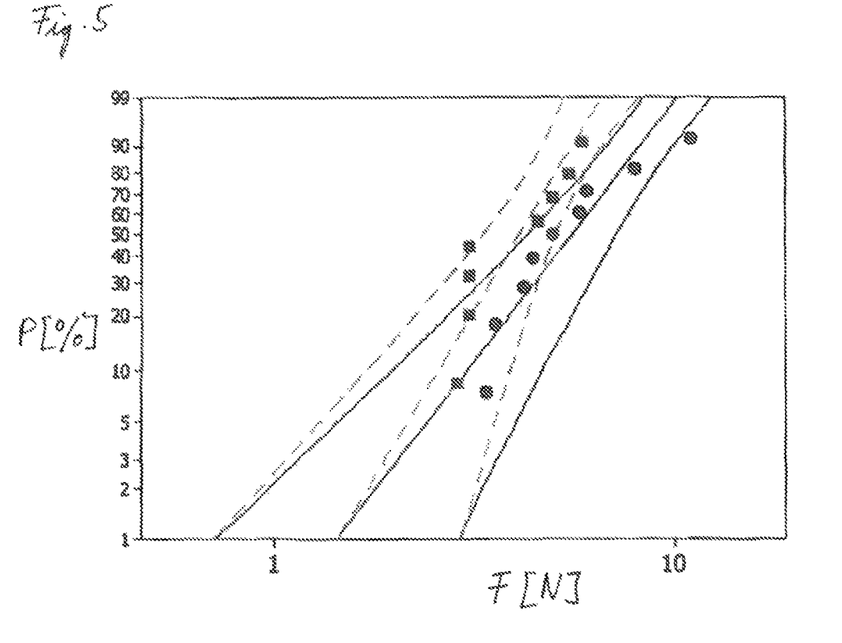
FIG. 5 shows in a diagram the frequency of a withdrawal of external contacts as a function of an exerted force.

FIG. 5 shows a diagram illustrating the frequency P of a withdrawal of various external contacts versus an exerted force F. A withdrawal of an external contact encompasses, for example, a crack of a further contact-connection, a partial detachment of a metallization or a detachment of the further contact-connection from the metallization.

For the withdrawal test, a component 1 in accordance with FIG. 3 having a further contact connection 18 in the form of a wire fabric was provided. In the head region, the second metallization 9 was masked with Kapton film, such that in this region the further contact connection 18 was not soldered with the second metallization 9. Afterward, the non-soldered piece of the further contact-connection 18 was acted on during the withdrawal test with various forces being exerted. The speed during withdrawal was 12.5 mm/min.

For comparison, the same test was carried out with a component 1 in which the first metallization 8 is embodied in a U-shaped fashion, that is to say—in contrast to the component 1 shown in FIG. 3—is not embodied in the form of a rectangle over the whole area. The measured values for a whole-area first metallization 8 are represented by circular symbols. Furthermore, a Weibull distribution represented by dashed lines is fitted to the measured values. The measured values for a U-shaped first metallization 8 are represented by the rectangular symbols. A Weibull distribution is fitted here, too, this distribution being represented by solid lines.

Overall, it can be gathered from the diagram that, in the case of a first metallization 8 applied over the whole area, the withdrawal forces are increased by approximately 40% relative to a first metallization applied in a U-shaped fashion. The mean value for the withdrawal force was 5.7 N with a standard deviation of 2.4 N in the case of a whole-area first metallization 8. The external contact 7 was withdrawn in 50% of the cases given a force F of 5.6 N and in 90% of the cases given a force of 8.2 N. The mean value for the withdrawal force was 4.1 N with a standard deviation of 1.2 N in the case of a U-shaped first metallization 8. The external contact 7 was withdrawn in 50% of the cases given a force F of 4.1 N and in 90% of the cases given a force of 5.6 N.

The invention claimed is:

1. An electrical component, comprising an external contact overlying a component body, the external contact having a first metallization and a second metallization, arranged on the first metallization, wherein the first and second metallizations are fired, wherein the second metallization only partly covers the first metallization, wherein the second metallization is U-shaped, wherein the U-shape has two legs and a connecting portion connecting the two legs, and wherein the legs and the connecting portion lie directly on the first metallization.

2. The electrical component according to claim 1, wherein the first and second metallizations have a different wettability with solder material.

3. The electrical component according to claim 1, wherein the first metallization has a glass portion and wherein the second metallization has no glass portion.

4. The electrical component according to claim 1, wherein the first metallization has a glass portion and wherein the second metallization has a smaller glass portion than the first metallization.

5. The electrical component according to claim 1, wherein the second metallization has at least one cutout.

6. The electrical component according to claim 1, wherein the first metallization is embodied as a continuous area without any cutouts.

7. The electrical component according to claim 1, wherein the second metallization has at least one cutout.

8. The electrical component according to claim 1, further comprising a contact element soldered on the second metallization.

9. The electrical component according to claim 8, wherein the contact element has a fabric structure.

10. The electrical component according to claim 8, further comprising a contact-connection fixed to the contact element, wherein the contact-connection is not arranged above the second metallization.

11. The electrical component according to claim 10, wherein the contact-connection is embodied as a contact pin.

12. An electrical component, comprising an external contact having a first metallization and a second metallization arranged on the first metallization, wherein the first and second metallizations are fired, wherein the second metallization has a cut-out, wherein the first metallization is present beneath the cut-out, and wherein the first metallization has a smaller wettability with solder material than the second metallization.

13. A method for establishing electrical contact with an electrical component, the method comprising:
providing a main body of an electrical component;
applying a first metallic paste on an outer side of the main body;
firing the first metallic paste to form a first metallization;

applying a second metallic paste to the first metallization; and firing the second metallic paste to form a second metallization.

14. The method according to claim 13, wherein the second metallization is formed so as to only partly cover the first metallization.

15. The method according to claim 13, wherein the second metallization is formed in a U-shaped fashion.

16. The method according to claim 13, wherein the first metallization has a glass portion and wherein the second metallization has no glass portion or a smaller glass portion than the first metallization.

* * * * *